United States Patent
Yoshimura et al.

(10) Patent No.: US 7,843,003 B2
(45) Date of Patent: Nov. 30, 2010

(54) INSULATED GATE SEMICONDUCTOR DEVICE

(75) Inventors: Mitsuhiro Yoshimura, Gunma (JP); Hiroko Inomata, Gunma (JP)

(73) Assignee: Sanyo Electric Co., Ltd, Osaka (JP)

(*) Notice: Subject to any disclaimer, the term of this patent is extended or adjusted under 35 U.S.C. 154(b) by 351 days.

(21) Appl. No.: 11/822,028

(22) Filed: Jun. 29, 2007

(65) Prior Publication Data

US 2008/0001221 A1    Jan. 3, 2008

(30) Foreign Application Priority Data

Jun. 30, 2006  (JP)  ............... 2006-181305

(51) Int. Cl.
*H01L 29/66* (2006.01)
(52) U.S. Cl. ............... 257/341; 257/256; 257/331; 257/401; 257/E29.198; 438/197
(58) Field of Classification Search ........... 257/256, 257/331, E29.198, 341, 401; 438/197
See application file for complete search history.

(56) References Cited

U.S. PATENT DOCUMENTS

| | | | | |
|---|---|---|---|---|
| 5,341,003 A | * | 8/1994 | Obinata | ............... 257/135 |
| 5,629,551 A | * | 5/1997 | Nakura et al. | ............... 257/470 |
| 5,994,752 A | * | 11/1999 | Sander et al. | ............... 257/467 |
| 6,140,680 A | * | 10/2000 | Pulvirenti | ............... 257/341 |
| 6,906,399 B2 | * | 6/2005 | Fruth et al. | ............... 257/577 |
| 7,118,951 B2 | * | 10/2006 | Yedinak et al. | ............. 438/197 |

FOREIGN PATENT DOCUMENTS

JP    2002-314086    10/2002

* cited by examiner

*Primary Examiner*—Wael M Fahmy
*Assistant Examiner*—John C Ingham
(74) *Attorney, Agent, or Firm*—Morrison & Foerster LLP

(57) ABSTRACT

An insulated gate semiconductor device includes a one conductivity type semiconductor layer, a first operation part in a surface of the semiconductor layer and a second operation part in the surface of the semiconductor layer that is smaller in area than the first operation part. A first channel region and a first transistor of an opposite conductivity type are provided in the first operation part and a second channel region and a second transistor of the opposite conductivity type are provided in the second operation part. The first operation part is disposed around the second operation part. Accordingly, design rules for four corner portions can be made uniform and depletion layer spreading in corner portions at a peripheral edge of a channel region of an operation part in application of a reverse voltage is also made approximately uniform. Thus, stable VDSS breakdown voltage characteristics can be obtained.

4 Claims, 5 Drawing Sheets

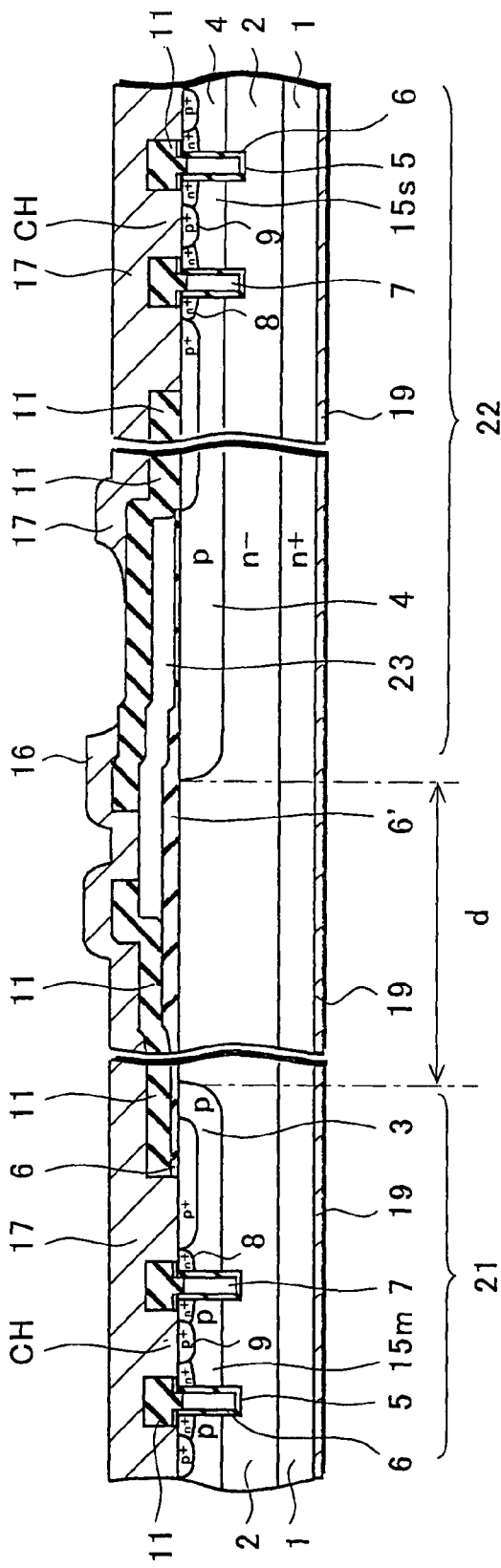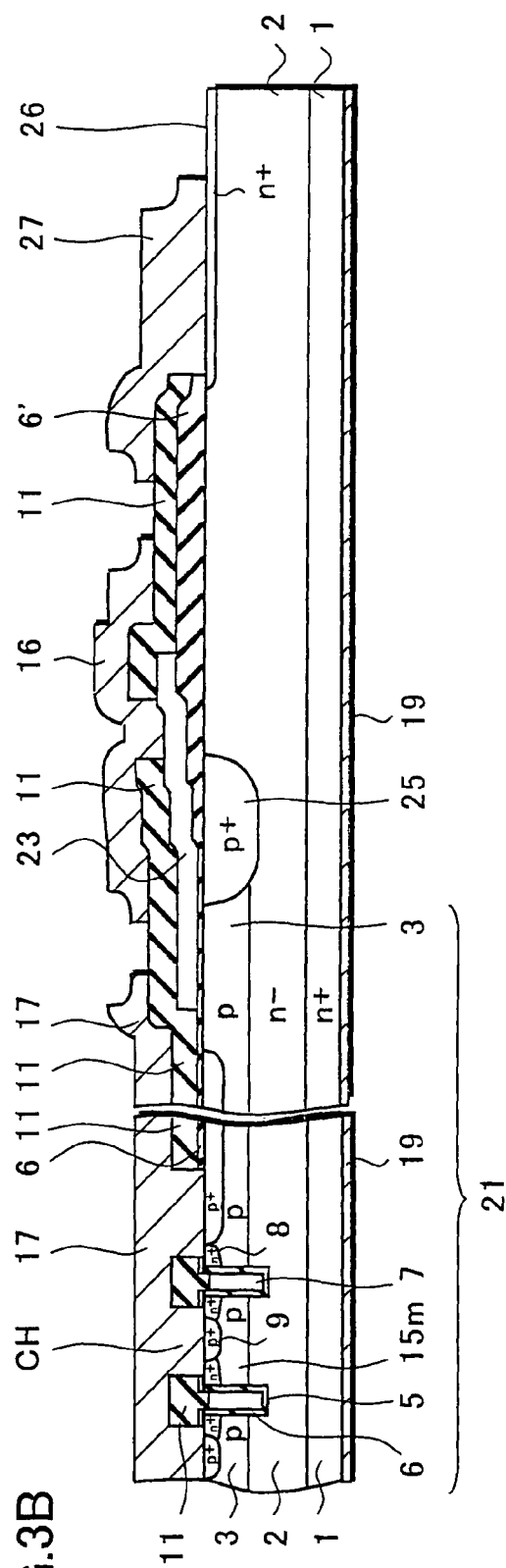

Prior Art

INSULATED GATE SEMICONDUCTOR DEVICE

CROSS-REFERENCE TO RELATED APPLICATIONS

This application claims priority from Japanese Patent Application Number JP2006-181305, filed on Jun. 30, 2006, the content of which is incorporated herein by reference in its entirety.

BACKGROUND OF THE INVENTION

1. Field of the Invention

The present invention relates to an insulated gate semiconductor device, and more particularly relates to an insulated gate semiconductor device having improved reliability by stabilizing VDSS breakdown voltage characteristics.

2. Description of the Related Art

As a conventional insulated gate semiconductor device, there has been known an insulated gate semiconductor device in which transistors performing main operations, and sensing transistors performing current detection and the like in the transistors are integrated into one chip. This technology is described for instance in Japanese Patent Application Publication No. 2002-314086.

FIG. 5 is a plan view showing a MOSFET having a trench structure, as an example of a conventional insulated gate semiconductor device. Note that metal electrode layers, such as a source electrode and a gate pad electrode, and an interlayer insulating film are not shown in FIG. 5.

As shown in FIG. 5, an operation part 41, in which MOS transistors 35m performing main operations are disposed, and a sense part 42, in which sensing MOS transistors 35s are disposed, are integrated in a MOSFET chip. Moreover, respective channel regions 33 and 34 of the operation part 41 and the sense part 42 are separated from each other at a predetermined interval.

A semiconductor substrate 30 is formed by stacking an n− type semiconductor layer on an n+ type silicon semiconductor substrate to obtain a drain region. The p type channel regions 33 and 34 are provided in a surface of the n+ type semiconductor layer. Moreover, trenches are provided in the channel regions 33 and 34, and gate electrodes are buried in the trenches after covering insides of the trenches with insulating films. The MOS transistors 35m and 35s are arranged, for example, in a lattice pattern. The MOS transistors 35m and 35s in the respective channel regions 33 and 34 have the same configuration.

The gate electrode which drives the sense part 42 is connected to the gate electrode in the operation part 41 by a gate connection electrode 36 made of polysilicon or the like. In the substrate surface, for example, at one of corner portions of the operation part 41, a gate pad electrode (not shown) is provided, which is connected to the gate connection electrode 36.

Specifically, the MOS transistors 35m and 35s in the operation part 41 and the sense part 42 are simultaneously driven, and a current is detected by the sense part 42. Thus, abnormalities such as an overcurrent in the operation part 41 are monitored and controlled.

In the conventional MOSFET, when the operation part 41 and the sense part 42 are integrated into one chip, as shown in FIG. 5, the channel regions 33 and 34 are separated from each other, and the MOS transistors 35m and 35s are formed and connected to one gate electrode.

The sense part 42 is disposed, for example, along a peripheral edge of the chip such as a corner portion of the chip.

Specifically, when the sense part 42 is provided, a peripheral shape of (the channel region 33 of) the operation part 41 has at least six or more corner portions along a shape of (the channel region 34 of) the sense part 42.

In such a case, curvatures of the respective corner portions at points X1 to X6 and points Z1 to Z4 in the respective channel regions 33 and 34 are set equal in order to secure a predetermined drain-source breakdown voltage (hereinafter referred to as a VDSS breakdown voltage). Moreover, curvatures of depletion layers spreading outward from the respective channel regions 33 and 34 in application of a reverse voltage are set approximately equal.

Note that, when patterns of the points X and Z are set to be convex parts, points Y to be concave parts are an advantageous pattern for the VDSS breakdown voltage since the depletion layers sufficiently spread compared with the convex parts. In other words, curvatures of the points Y have almost no influence on the VDSS breakdown voltage. Thus, it is only necessary to give consideration to the points X and Z.

Here, for example, in the case where the operation part 41 and the sense part 42 are disposed close to each other to the extent that the depletion layer spreading from the operation part 41 and the depletion layer spreading from the sense part 42 are pinched off in a hatching region, the breakdown voltage of the chip is influenced by the curvatures at the points X1, Z2 and X4 to X6. Specifically, if the curvatures of at least the points X1, Z2 and X4 to X6 are set equal, theoretically, the depletion layers spreading outward are set approximately uniform in the entire chip. Thus, a decrease in the breakdown voltage is prevented.

The transistors in the operation part 41 and the sense part 42 have the same configuration. When measurements are made in the operation part 41 and the sense part 42 as discrete chips shown in FIG. 5, gate-source voltages and drain-source voltages, which are applied to the respective parts, are the same.

However, in an actual application, for example, a current detection resistance outside the chip is connected only to the sense part 42, and a current in the operation part 41 is detected by a control IC. Thus, the applied gate-source voltages and drain-source voltages differ between the operation part 41 and the sense part 42.

Accordingly, for example, even if the curvatures of the point X1 in the channel region 33 and the point Z2 in the channel region 34 are equal, the drain-source voltages applied to the operation part 41 and the sense part 42 are different from each other. This causes a variation in the depletion layers spreading at the points X1 and Z2, and produces a problem of a variation in the VDSS breakdown voltage.

Meanwhile, in the case where the operation part 41 and the sense part 42 are disposed so as to be separated from each other to the extent that the depletion layers spreading from the operation part 41 and the sense part 42 are not pinched off in application of the reverse voltage in the hatching region, the curvatures of the points X1 to X6 and Z1 to Z4 to be the respective corner portions are all set equal. Consequently, a stable VDSS breakdown voltage can be obtained in the entire chip.

However, in the above case, it is necessary to provide a sufficient space between the operation part 41 and the sense part 42 (the hatching region) and to sufficiently reduce the curvature so as to obtain a predetermined breakdown voltage at each of the corner portions. For this reason, there is a problem that arrangement areas (the number of cells) of the MOS transistors 35*m* and 35*s* are reduced.

BRIEF SUMMARY OF THE INVENTION

In one embodiment, an insulated gate semiconductor device includes a one conductivity type semiconductor layer, a first operation part provided in a surface of the semiconductor layer, a second operation part which is provided in the surface of the semiconductor layer, and which is smaller in area than the first operation part, a first channel region and a first transistor of an opposite conductivity type, which are provided in the first operation part and a second channel region and a second transistor of the opposite conductivity type, which are provided in the second operation part, wherein the first operation part is disposed around the second operation part.

In one embodiment, an insulated gate semiconductor device includes a one conductivity type semiconductor substrate, a one conductivity type semiconductor layer provided on the substrate, a first operation part provided in a surface of the semiconductor layer, a second operation part which is provided in the surface of the semiconductor layer so as to be separated from the first operation part, and which is smaller in area than the first operation part, a first opposite conductivity type channel region provided in the first operation part, a first insulated gate transistor provided in the first operation part, a second opposite conductivity type channel region provided in the second operation part and a second insulated gate transistor provided in the second operation part, wherein a periphery of the second operation part is completely surrounded by the first operation part.

In one embodiment, in the first operation part, the first channel region may be formed in a rectangular shape, and curvatures of respective corner portions of the rectangular shape may be equal.

In one embodiment, the second channel region may be formed in a rectangular shape, and curvatures of respective corner portions of the rectangular shape may be equal.

In one embodiment, the first and second channel regions may be disposed so as to be separated from each other by a distance which allows depletion layers to come into contact with each other, the depletion layers spreading in the semiconductor layer when a reverse voltage is applied to the first and second transistors.

In one embodiment, the first and second transistors respectively may have gate electrodes common-connected.

In one embodiment, the second transistor may be a transistor for detecting a current in the first transistor.

BRIEF DESCRIPTION OF THE DRAWINGS

FIGS. 3A and 3B are cross-sectional views showing the semiconductor device of the preferred embodiment of the invention.

DETAILED DESCRIPTION

With reference to FIGS. 1 to 4, an embodiment of the present invention will be described in detail by taking a MOS-FET having an n channel type trench structure as an example of an insulated gate semiconductor device.

Figure 1:
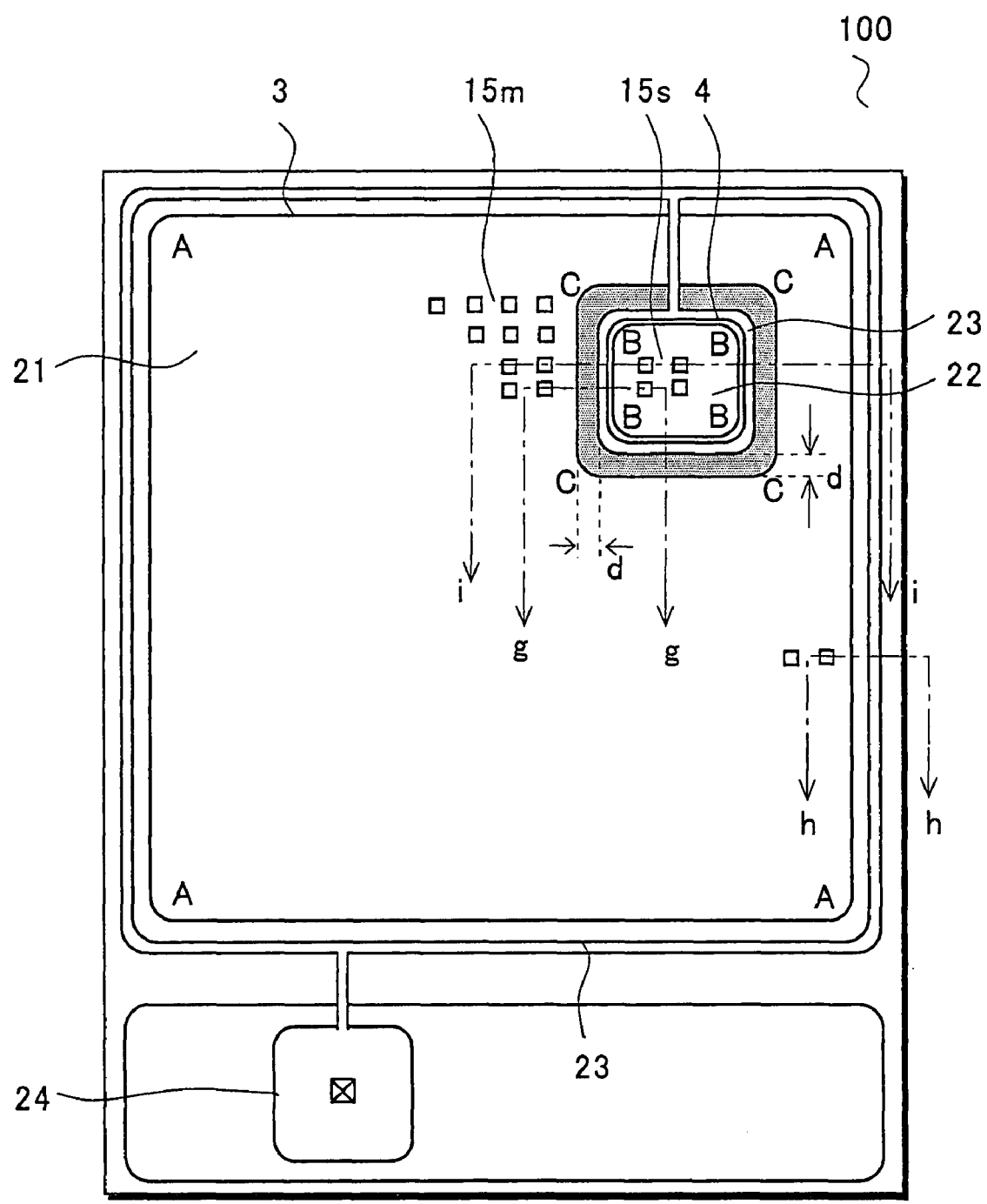
FIG. 1 is a plan view showing a semiconductor device of a preferred embodiment of the invention.

FIG. 1 is a plan view showing a MOSFET chip according to the embodiment of the present invention. Note that an interlayer insulating film and metal electrode layers (a source electrode, a gate pad electrode and a gate wiring) are not shown in FIG. 1.

A MOSFET 100 of the present embodiment includes an n type semiconductor layer 2, a first operation part 21, a second operation part 22, a first channel region 3, a second channel region 4, first transistors 15*m* and second transistors 15*s*.

A drain region is obtained by stacking an n− type semiconductor layer on an n+ type silicon semiconductor substrate (neither of which are shown here). The n− type semiconductor layer is, for example, an epitaxial layer.

The first operation part 21 is a region where a number of the first transistors 15*m* which perform main operations are arranged. Meanwhile, the second operation part 22 is smaller in an area than the first operation part 21 and is a region where a small number of the second transistors 15*s* which perform sensing of the first transistors 15*m* are arranged.

Although not shown in detail in FIG. 1, the first and second transistors 15*m* and 15*s* are arranged equally spaced apart in the first and second operation parts 21 and 22. Note that it is required to provide a source electrode also on the second operation part 22 for wire bonding. Specifically, although a region where the second transistors 15*s* are actually arranged in the second operation part 22 is very fine, the area required at least for the wire bonding is secured. The first and second transistors 15*m* and 15*s* have the same configuration and are simultaneously operated. Moreover, a current in the second transistors 15*s* is detected by a control IC (not shown) to monitor and control a state of the first transistors 15*m*. In this embodiment, the first operation part 21 and the second operation part 22 will be hereinafter called an operation part 21 and a sense part 22, respectively.

In a surface of the n− type semiconductor layer in the operation part 21 and the sense part 22, a first channel region 3 and a second channel region 4 are provided, which correspond to the operation part 21 and the sense part 22, respectively. Each of the first and second channel regions 3 and 4 in this embodiment is, for example, one continuous diffusion region obtained by implanting and diffusing p type impurities into the surface of the n− type semiconductor layer. The first and second channel regions 3 and 4 are disposed so as to be separated from each other by a distance d which allows depletion layers to come into contact with each other, the depletion layers spreading in the n− type semiconductor layer 2 from both regions 3 and 4 when a reverse voltage is applied to the first and second transistors 15*m* and 15*s*.

Moreover, in this embodiment, in terms of a pattern (planar pattern) in the substrate surface (FIG. 1), the first channel region 3 and the operation part 21 correspond to each other and the second channel region 4 and the sense part 22 correspond to each other. Specifically, an edge of the operation part 21 means an edge of the first channel region 3, and an edge of the sense part 22 means an edge of the second channel region 4.

A gate connection electrode 23 extended around the operation part 21 (the first channel region 3) and the sense part 22 (the second channel region 4) is made of polysilicon or the like and is common-connected to gate electrodes (not shown here) in the operation part 21 and the sense part 22. The gate connection electrode 23 is extended to a gate pad formation region 24 outside the operation part 21, and is connected to a gate pad electrode (not shown) which is provided above the n– type semiconductor layer 2 with an insulating film interposed therebetween in the gate pad formation region 24.

Thus, the same gate voltage is applied to the operation part 21 and the sense part 22 at the same time.

Figure 2:
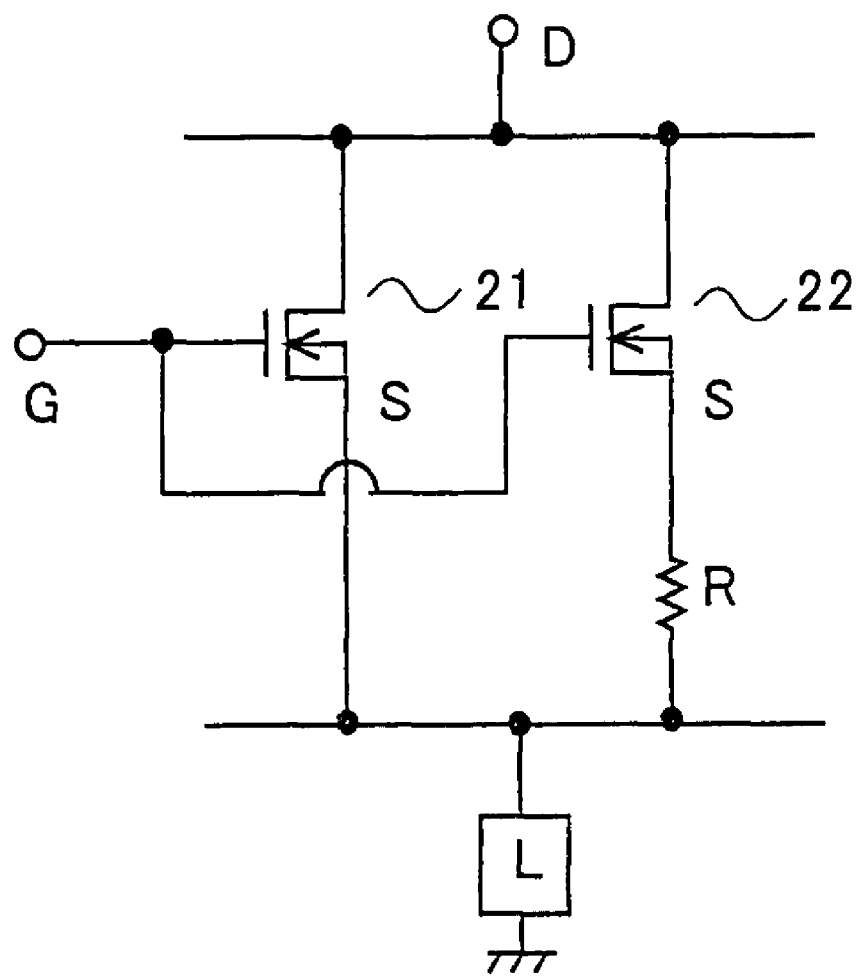
FIG. 2 is a circuit diagram showing the semiconductor device of the preferred embodiment of the invention.

FIG. 2 is a circuit diagram showing an example of use of the MOSFET shown in FIG. 1. In the MOSFET of this embodiment, the operation part 21 and the sense part 22, in which the transistors for sensing the current in the operation part 21 are arranged, are integrated into one chip. The sense part 22 and the operation part 21 are simultaneously operated by the same gate voltage applied at the same time.

As shown in FIG. 2, the MOS transistors 15s in the sense part 22 and the MOS transistors 15m in the operation part 21 have a drain D common-connected and sources S grounded through a load L, respectively. Between the source S in the sense part 22 and the load L, a resistor R is connected. For example, by measuring a voltage drop at both ends of the resistor R, a current flowing through the MOS transistors 15s in the sense part 22 is detected. The MOS transistors 15m in the operation part 21 have the same configuration as that of the transistor in the sense part 22. Thus, by making a measurement in the sense part 22, an overcurrent and the like in the operation part 21 are detected. The sense part 22 and the operation part 21 have gates G connected to an unillustrated control IC or the like. When abnormalities such as the overcurrent are detected in the sense part 22, the control IC controls the MOS transistors 15m in the operation part 21 (as well as the MOS transistors 15s in the sense part 22).

In such a MOSFET to be used in an application, the depletion layers can be nonuniformly spread between the operation part 21 and the sense part 22. Specifically, in the case of the MOSFET in which the operation part 21 and the sense part 22 are integrated into one chip, when measurements are made in the MOSFET as a discrete chip, the amount of drain-source voltages and gate-source voltages to be applied is the same between the operation part 21 and the sense part 22. However, when the resistor R for current detection is connected to only the sense part 22 as described above in the application, the amount of the drain-source voltages applied to the sense part 22 and the operation part 21 differs from each other. Accordingly, the depletion layers can be nonuniformly spread between the sense part 22 and the operation part 21.

However, in this embodiment, even in such a case, an outermost periphery of the chip is in the first channel region 3 in which curvatures of respective corner portions are equal. Thus, a VDSS breakdown voltage can be stabilized in the chip. Moreover, the first and second channel regions 3 and 4 are disposed at the distance d such that the depletion layers which spreads from the both regions 3 and 4 are pinched off when the reverse voltage is applied. Therefore, the depletion layer spreading from the sense part 22 has its four sides all pinched off by the depletion layer spreading from the operation part 21. Therefore, the VDSS breakdown voltage can be stabilized also in the sense part 22.

FIGS. 3A and 3B are cross-sectional views showing the MOSFET 100 in FIG. 1. FIG. 3A is a cross-sectional view along the line g-g in FIG. 1. FIG. 3B is a cross-sectional view along the line h-h in FIG. 1.

With reference to FIGS. 3A and 3B, the drain region is provided by stacking the n– type semiconductor layer 2 on the n+ type silicon semiconductor substrate 1. On the surface of the n– type semiconductor layer 2, the p type first and second channel regions 3 and 4 are provided, which correspond to the operation part 21 and the sense part 22, respectively. The first and second channel regions 3 and 4 are separated from each other by the distance d for which the depletion layers spreading from the both regions are pinched off in application of the reverse voltage.

Each of trenches 5 has a depth penetrating the first and second channel regions 3 and 4 and reaching the n– type semiconductor layer 2. An inner wall of the trench 5 is covered with a gate insulating film (for example, an oxide film) 6 and a gate electrode 7 is provided by filling the trench 5 with polysilicon or the like. The gate electrode 7 is connected to a gate pad electrode through the gate connection electrode 23 provided on an insulating film 6' around the operation part 21 and the sense part 22.

In surfaces of the first and second channel regions 3 and 4 adjacent to the trenches 5, n+ type source regions 8 are formed. Moreover, in the surfaces of the first and second channel regions 3 and 4 between the source regions 8 adjacent to each other, p+ type body regions 9 are provided.

An interlayer insulating film 11 made of a BPSG (Boron Phosphorus Silicate Glass) film or the like is provided so as to cover the gate electrodes 7. A source electrode 17 comes into contact with the source regions 8 and the body regions 9 through contact holes CH provided in the interlayer insulating film 11.

Moreover, in the surface of the n– type semiconductor layer 2 around the first channel region 3, a guard ring 25 in which p+ type impurities are diffused is provided as needed. Furthermore, in the surface of the n– type semiconductor layer 2 in the outermost periphery of the chip, an n+ type impurity region 26 is provided, and a shield metal 27 comes into contact with a part of the region (see FIG. 3B).

The source electrode 17 is provided adjacent to the gate pad formation region 24 (see FIG. 1). A gate pad electrode (not shown) provided in the gate pad formation region 24 is formed of the same metal electrode layer as that of the source electrode 17. The source electrodes 17 in the operation part 21 and the sense part 22 are separated from each other but electrically connected to the MOS transistors 15m and 15s, respectively.

On the gate connection electrode 23 surrounding the first channel region 3, a ring-shaped gate wiring 16 is provided so as to overlap with the electrode. Furthermore, a drain electrode 19 is provided on a rear surface of the substrate 1 by metal evaporation and the like.

Figure 4:
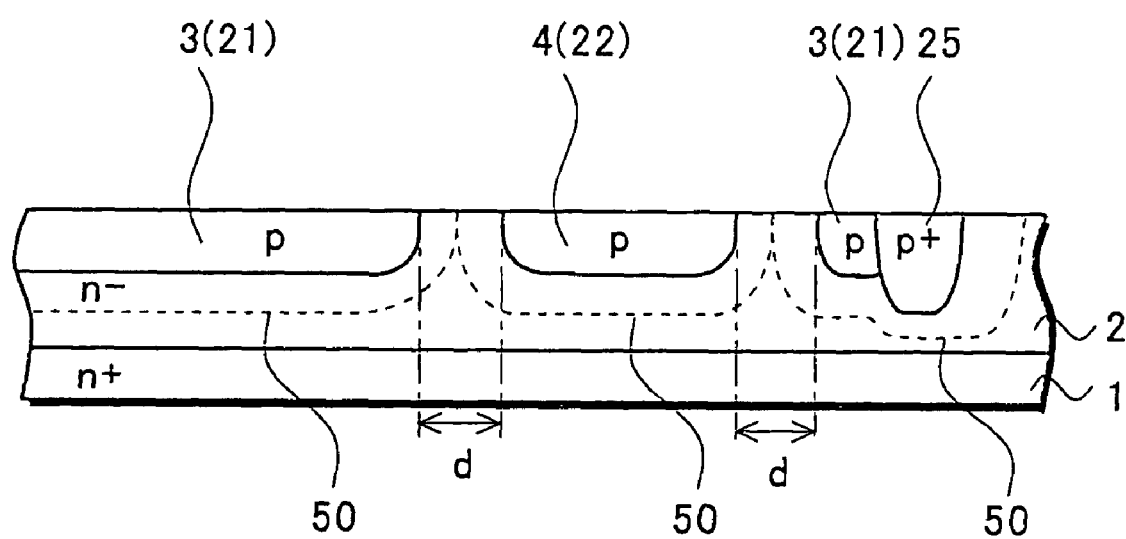
FIG. 4 is a cross-sectional view showing the semiconductor device of the preferred embodiment of the invention.
Figure 5:
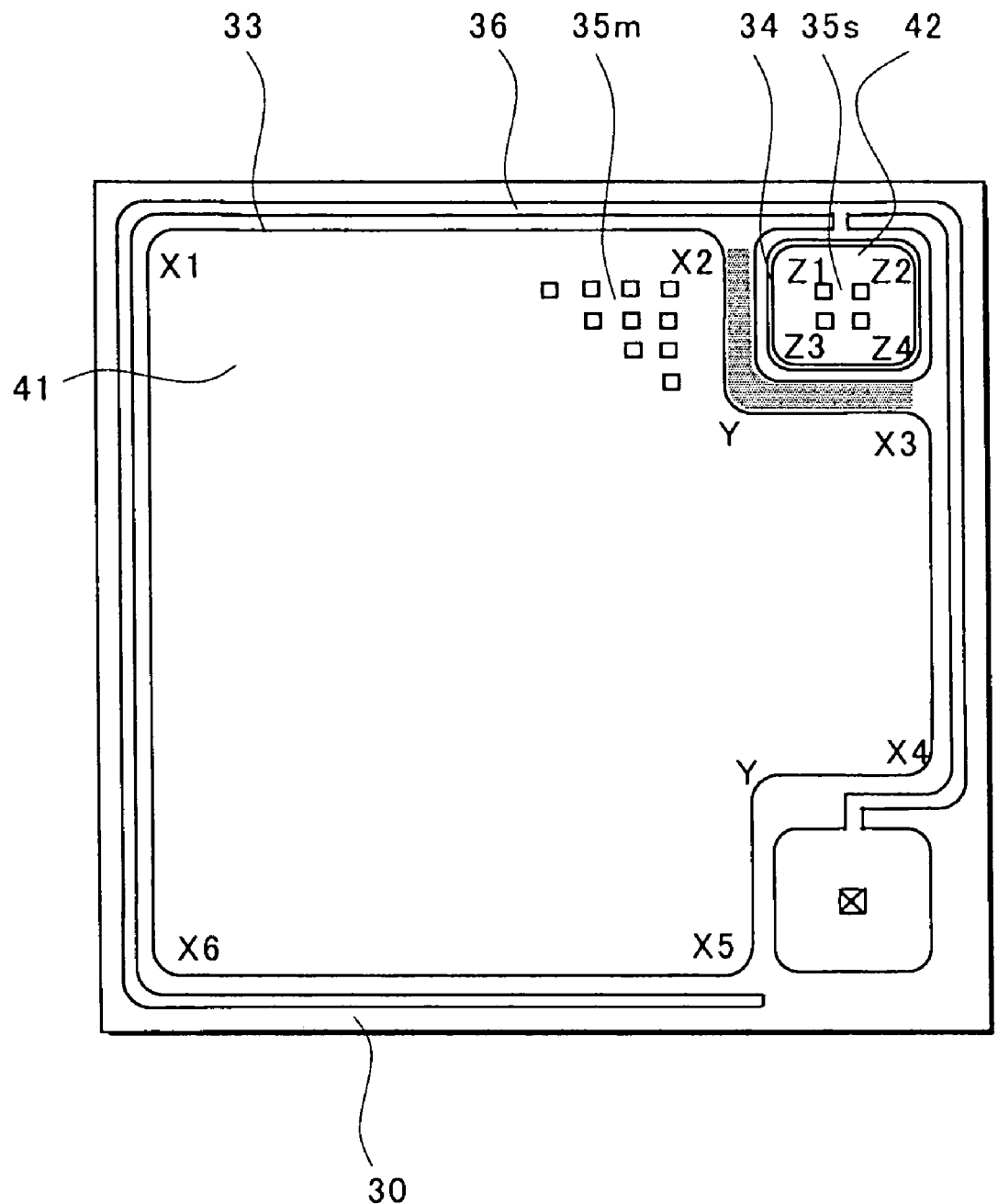
FIG. 5 is a plan view showing a conventional semiconductor device.

FIG. 4 is a cross-sectional view along the line i-i in FIG. 1, schematically showing the first and second channel regions 3 and 4. Although not shown in FIG. 4, the MOS transistors 15m and 15s are disposed in the first and second channel regions 3 and 4, respectively.

The first and second channel regions 3 and 4 are disposed at the distance d for which the depletion layers spreading from the both regions are pinched off in application of the reverse voltage. Therefore, it is not required to set curvatures of points A and B to be equal. Moreover, the first channel region 3, which is to be a concave part when the points A are set to be convex parts and faces the second channel region 4, is a pattern in which the depletion layer sufficiently spreads compared with the points A. Specifically, if curvatures of four corner portions at points C are equal, the curvatures at the points C have almost no influence on the VDSS breakdown voltage. Thus, it is not required to give consideration thereto here.

Specifically, a space between the first and second channel regions 3 and 4 (the hatching region in FIG. 1) is set to the distance d for which the depletion layers are pinched off. Thus, the depletion layers spreading outward at the peripheral edge of the chip 100 can be set to be a main design factor of the VDSS breakdown voltage.

Moreover, as shown in FIG. 1, the second channel region 4 (the sense part 22) in this embodiment has its four sides completely surrounded by the first channel region 3 (the operation part 21).

Thus, in the chip of the MOSFET 100, a channel region in a chip outermost periphery for determining the VDSS breakdown voltage can be set to be only the first channel region 3. Therefore, for the VDSS breakdown voltage of the chip, it is only necessary to give consideration to only the pattern at the edge of the first channel region 3. Thus, it becomes easy to design a stable VDSS breakdown voltage.

Moreover, by disposing the second channel region 4 inside the first channel region 3, the outer edge pattern of the first channel region 3 has a rectangular shape having the four corner portions (the points A). Each of the corner portions does not have a perfect right angle but has a predetermined curvature. At the respective points A, the curvatures of the corner portions are equal.

Furthermore, the outer edge pattern of the second channel region 4 also has a rectangular shape having the four corner portions (the points B). Each of the corner portions does not have a perfect right angle but has a predetermined curvature. At the respective points B, the curvatures of the corner portions are equal.

Specifically, in this embodiment, the depletion layer spreading into the n-type semiconductor layer 2 from the peripheral edge of the first channel region 3 in application of the reverse voltage becomes approximately uniform at the respective four corner portions (the points A). Therefore, VDSS breakdown voltage characteristics can be stabilized in the entire chip.

Furthermore, as described above, in the case of use in the application shown in FIG. 2, the drain-source voltages applied to the operation part 21 and the sense part 22 can not be the same. However, in this embodiment, the VDSS breakdown voltage of the chip can be controlled at the four corner portions (the points A) having the equal curvature in the first channel region 3. Thus, a stable VDSS breakdown voltage can be obtained.

Although the description has been given above of the n-channel MOSFET in this embodiment, the same effects can be achieved also in a p channel MOSFET having an opposite conductivity type. Furthermore, the present invention is not limited to the MOSFET having the trench structure but can be similarly applied to a MOSFET having a planar structure in which a gate electrode 7 is disposed on a surface of an n– type semiconductor layer 2 with a gate insulating film 6 interposed therebetween.

Firstly, according to the preferred embodiment of the present invention, in a MOSFET having a sense part and an operation part, a channel region in a chip outermost periphery for determining the VDSS breakdown voltage can be set to be only a first channel region. Therefore, for the VDSS breakdown voltage of the chip, it is only necessary to give consideration to only the pattern at the edge of the first channel region. Thus, it becomes easy to design a stable VDSS breakdown voltage.

Secondly, by forming the first channel region into a rectangular shape, the curvatures of the respective corner portions in the outermost periphery of the first channel region can be equal. Accordingly, the depletion layer can be spread approximately uniformly at the respective corner portions in the outermost periphery of the chip. Thus, the VDSS breakdown voltage characteristics are stabilized, and reliability can be improved.

Thirdly, even if the depletion layers nonuniformly spread between the sense part and the operation part, the VDSS breakdown voltage can be stabilized in the chip. Specifically, the first and second channel regions are disposed at the distance such that the depletion layers are pinched off when the reverse voltage is applied. In the case of the insulated gate semiconductor device in which the sense part and the operation part are integrated into one chip, even if the same performance is realized as a discrete chip, a drain-source voltages applied to the sense part and the operation part differ from each other due to a current detection resistor or the like connected to the sense part in the application. Accordingly, the depletion layers can nonuniformly spread between the sense part and the operation part. However, in this embodiment, even in such a case, the outermost periphery of the chip is the first channel region in which the curvatures of the respective corner portions are equal. Thus, the VDSS breakdown voltage can be stabilized in the chip. Moreover, the depletion layer spreading from the sense part has its four sides all pinched off by the depletion layer spreading from the operation part. Therefore, the VDSS breakdown voltage can be stabilized also in the sense part.

What is claimed is:

1. An insulated gate semiconductor device comprising:
a semiconductor layer of a first conductivity type;
a first operation part provided in a surface of the semiconductor layer;
a second operation part provided in the surface of the semiconductor layer so as to be smaller in area than the first operation part;
a first channel region of a second conductivity type opposite from the first conductivity type provided in the first operation part;
a first transistor provided in the first operation part and comprising a gate electrode;
a second channel region of the second conductivity type provided in the second operation part;
a second transistor provided in the second operation part and comprising a gate electrode;
a gate connection electrode formed of a semiconductor and connected to the gates of the first and second transistors; and
a gate wiring formed of a metal and disposed on the gate connection electrode so as to be electrically in contact with the gate connection electrode,
wherein in plan view of the insulated gate semiconductor device the first operation part is disposed around the second operation part,
in the plan view of the insulated gate semiconductor device the gate connection electrode and the gate wiring are disposed between the first operation part and the second operation part,
the first operation part is formed in a rectangular shape, and curvatures of four corner portions of the rectangular shape are equal, and
the first and second channel regions are disposed so as to be separated from each other by a distance which allows depletion layers to come into contact with each other, the depletion layers spreading in the semiconductor layer when a reverse voltage is applied to the first and second transistors.

2. The insulated gate semiconductor device according to claim 1, wherein the second operation part is formed in a rectangular shape, and curvatures of four corner portions of the rectangular shape are equal.

3. The insulated gate semiconductor device according to claim 1, wherein the second transistor is a transistor for detecting a current in the first transistor.

4. The insulated gate semiconductor device according to claim 1, wherein none of four outer peripheral lines of the rectangular shape includes a bending portion except for the four corner portions.

* * * * *